United States Patent
Zheng et al.

(10) Patent No.: US 9,361,913 B1
(45) Date of Patent: Jun. 7, 2016

(54) RECORDING READ HEADS WITH A MULTI-LAYER AFM LAYER METHODS AND APPARATUSES

(71) Applicant: Western Digital (Fremont), LLC, Fremont, CA (US)

(72) Inventors: Yuankai Zheng, Fremont, CA (US); Qunwen Leng, Palo Alto, CA (US)

(73) Assignee: Western Digital (Fremont), LLC, Fremont, CA (US)

(*) Notice: Subject to any disclaimer, the term of this patent is extended or adjusted under 35 U.S.C. 154(b) by 125 days.

(21) Appl. No.: 13/923,991

(22) Filed: Jun. 21, 2013

Related U.S. Application Data

(60) Provisional application No. 61/830,238, filed on Jun. 3, 2013.

(51) Int. Cl.
*G11B 5/31* (2006.01)
*H01F 10/13* (2006.01)

(52) U.S. Cl.
CPC ............ *G11B 5/3143* (2013.01); *G11B 5/3163* (2013.01); *H01F 10/135* (2013.01)

(58) Field of Classification Search
None
See application file for complete search history.

(56) References Cited

U.S. PATENT DOCUMENTS

| | | | |
|---|---|---|---|
| 5,804,250 A | 9/1998 | Yang | |
| 6,016,290 A | 1/2000 | Chen et al. | |
| 6,018,441 A | 1/2000 | Wu et al. | |
| 6,025,978 A | 2/2000 | Hoshi et al. | |
| 6,025,988 A | 2/2000 | Yan | |
| 6,032,353 A | 3/2000 | Hiner et al. | |
| 6,033,491 A | 3/2000 | Lin | |
| 6,033,532 A | 3/2000 | Minami | |
| 6,034,851 A | 3/2000 | Zarouri et al. | |
| 6,043,959 A | 3/2000 | Crue et al. | |
| 6,046,885 A | 4/2000 | Aimonetti et al. | |
| 6,049,650 A | 4/2000 | Jerman et al. | |
| 6,055,138 A | 4/2000 | Shi | |
| 6,058,094 A | 5/2000 | Davis et al. | |
| 6,073,338 A | 6/2000 | Liu et al. | |
| 6,078,479 A | 6/2000 | Nepela et al. | |
| 6,081,499 A | 6/2000 | Berger et al. | |
| 6,094,803 A | 8/2000 | Carlson et al. | |
| 6,099,362 A | 8/2000 | Viches et al. | |
| 6,103,073 A | 8/2000 | Thayamballi | |
| 6,108,166 A | 8/2000 | Lederman | |
| 6,118,629 A | 9/2000 | Huai et al. | |
| 6,118,638 A | 9/2000 | Knapp et al. | |
| 6,125,018 A | 9/2000 | Takagishi et al. | |
| 6,129,957 A | 10/2000 | Xiao et al. | |
| 6,130,779 A | 10/2000 | Carlson et al. | |
| 6,134,089 A | 10/2000 | Barr et al. | |
| 6,136,166 A | 10/2000 | Shen et al. | |
| 6,137,661 A | 10/2000 | Shi et al. | |
| 6,137,662 A | 10/2000 | Huai et al. | |
| 6,160,684 A | 12/2000 | Heist et al. | |
| 6,163,426 A | 12/2000 | Nepela et al. | |
| 6,166,891 A | 12/2000 | Lederman et al. | |
| 6,173,486 B1 | 1/2001 | Hsiao et al. | |
| 6,175,476 B1 | 1/2001 | Huai et al. | |

(Continued)

*Primary Examiner* — Kevin Bernatz

(57) ABSTRACT

Apparatuses and methods of recording read heads with a multi-layer anti-ferromagnetic (AFM) layer are provided. The AFM layer has gradient Manganese (Mn) compositions. A multi-layer AFM layer comprises a plurality of sub-layers having different Mn compositions. An upper sub-layer has a higher Mn composition than an lower sub-layer. Different types of gases may be used to deposit each sub-layer and the flow of each gas may be adjusted.

9 Claims, 2 Drawing Sheets

(56) References Cited

U.S. PATENT DOCUMENTS

| | | |
|---|---|---|
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,208,492 B1 | 3/2001 | Pinarbasi |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,315,839 B1 | 11/2001 | Pinarbasi et al. |
| 6,317,290 B1 | 11/2001 | Wang et al. |
| 6,317,297 B1 | 11/2001 | Tong et al. |
| 6,322,640 B1 | 11/2001 | Xiao et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,413,325 B1 | 7/2002 | Shimazawa et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,015 B2 | 8/2002 | Ju et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,385 B1 | 9/2002 | Shimazawa et al. |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,478,884 B2 | 11/2002 | Shimazawa et al. |
| 6,479,096 B1 | 11/2002 | Shi et al. |
| 6,482,657 B2 | 11/2002 | Shimazawa |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |

(56) References Cited

U.S. PATENT DOCUMENTS

| | | | |
|---|---|---|---|
| 6,707,083 B1 | 3/2004 | Hiner et al. | |
| 6,710,985 B2 | 3/2004 | Noma | |
| 6,713,801 B1 | 3/2004 | Sin et al. | |
| 6,721,138 B1 | 4/2004 | Chen et al. | |
| 6,721,149 B1 | 4/2004 | Shi et al. | |
| 6,721,203 B1 | 4/2004 | Qi et al. | |
| 6,724,569 B1 | 4/2004 | Chen et al. | |
| 6,724,572 B1 | 4/2004 | Stoev et al. | |
| 6,724,581 B2 | 4/2004 | Westwood | |
| 6,729,015 B2 | 5/2004 | Matono et al. | |
| 6,735,850 B1 | 5/2004 | Gibbons et al. | |
| 6,737,281 B1 | 5/2004 | Dang et al. | |
| 6,740,398 B2 * | 5/2004 | Platt | 428/829 |
| 6,744,608 B1 | 6/2004 | Sin et al. | |
| 6,747,301 B1 | 6/2004 | Hiner et al. | |
| 6,751,055 B1 | 6/2004 | Alfoqaha et al. | |
| 6,754,048 B2 | 6/2004 | Li et al. | |
| 6,754,049 B1 | 6/2004 | Seagle et al. | |
| 6,756,071 B1 | 6/2004 | Shi et al. | |
| 6,757,140 B1 | 6/2004 | Hawwa | |
| 6,760,196 B1 | 7/2004 | Niu et al. | |
| 6,762,910 B1 | 7/2004 | Knapp et al. | |
| 6,765,756 B1 | 7/2004 | Hong et al. | |
| 6,775,902 B1 | 8/2004 | Huai et al. | |
| 6,778,358 B1 | 8/2004 | Jiang et al. | |
| 6,781,927 B1 | 8/2004 | Heanuc et al. | |
| 6,785,955 B1 | 9/2004 | Chen et al. | |
| 6,791,793 B1 | 9/2004 | Chen et al. | |
| 6,791,807 B1 | 9/2004 | Hikami et al. | |
| 6,798,616 B1 | 9/2004 | Seagle et al. | |
| 6,798,625 B1 | 9/2004 | Ueno et al. | |
| 6,801,408 B1 | 10/2004 | Chen et al. | |
| 6,801,411 B1 | 10/2004 | Lederman et al. | |
| 6,803,615 B1 | 10/2004 | Sin et al. | |
| 6,806,035 B1 | 10/2004 | Atireklapvarodom et al. | |
| 6,807,030 B1 | 10/2004 | Hawwa et al. | |
| 6,807,332 B1 | 10/2004 | Hawwa | |
| 6,809,899 B1 | 10/2004 | Chen et al. | |
| 6,816,345 B1 | 11/2004 | Knapp et al. | |
| 6,828,897 B1 | 12/2004 | Nepela | |
| 6,829,160 B1 | 12/2004 | Qi et al. | |
| 6,829,819 B1 | 12/2004 | Crue, Jr. et al. | |
| 6,833,979 B1 | 12/2004 | Spallas et al. | |
| 6,834,010 B1 | 12/2004 | Qi et al. | |
| 6,848,169 B2 | 2/2005 | Shin et al. | |
| 6,859,343 B1 | 2/2005 | Alfoqaha et al. | |
| 6,859,997 B1 | 3/2005 | Tong et al. | |
| 6,861,937 B1 | 3/2005 | Feng et al. | |
| 6,870,712 B2 | 3/2005 | Chen et al. | |
| 6,873,494 B2 | 3/2005 | Chen et al. | |
| 6,873,547 B1 | 3/2005 | Shi et al. | |
| 6,876,507 B2 | 4/2005 | Chen et al. | |
| 6,879,464 B2 | 4/2005 | Sun et al. | |
| 6,888,184 B1 | 5/2005 | Shi et al. | |
| 6,888,704 B1 | 5/2005 | Diao et al. | |
| 6,891,702 B1 | 5/2005 | Tang | |
| 6,894,871 B2 | 5/2005 | Alfoqaha et al. | |
| 6,894,877 B1 | 5/2005 | Crue, Jr. et al. | |
| 6,906,894 B2 | 6/2005 | Chen et al. | |
| 6,909,578 B1 | 6/2005 | Missell et al. | |
| 6,912,106 B1 | 6/2005 | Chen et al. | |
| 6,934,113 B1 | 8/2005 | Chen | |
| 6,934,129 B1 | 8/2005 | Zhang et al. | |
| 6,940,688 B2 | 9/2005 | Jiang et al. | |
| 6,942,824 B1 | 9/2005 | Li | |
| 6,943,993 B2 | 9/2005 | Chang et al. | |
| 6,944,938 B1 | 9/2005 | Crue, Jr. et al. | |
| 6,947,258 B1 | 9/2005 | Li | |
| 6,950,266 B1 | 9/2005 | McCaslin et al. | |
| 6,954,332 B1 | 10/2005 | Hong et al. | |
| 6,958,885 B1 | 10/2005 | Chen et al. | |
| 6,961,221 B1 | 11/2005 | Niu et al. | |
| 6,969,989 B1 | 11/2005 | Mei | |
| 6,975,486 B2 | 12/2005 | Chen et al. | |
| 6,987,643 B1 | 1/2006 | Seagle | |
| 6,989,962 B1 | 1/2006 | Dong et al. | |
| 6,989,972 B1 | 1/2006 | Stoev et al. | |
| 6,998,061 B1 | 2/2006 | Cross | |
| 7,006,327 B2 | 2/2006 | Krounbi et al. | |
| 7,007,372 B1 | 3/2006 | Chen et al. | |
| 7,012,832 B1 | 3/2006 | Sin et al. | |
| 7,023,658 B1 | 4/2006 | Knapp et al. | |
| 7,026,063 B2 | 4/2006 | Ueno et al. | |
| 7,027,268 B1 | 4/2006 | Zhu et al. | |
| 7,027,274 B1 | 4/2006 | Sin et al. | |
| 7,035,046 B1 | 4/2006 | Young et al. | |
| 7,041,985 B1 | 5/2006 | Wang et al. | |
| 7,046,490 B1 | 5/2006 | Ueno et al. | |
| 7,054,113 B1 | 5/2006 | Seagle et al. | |
| 7,057,857 B1 | 6/2006 | Niu et al. | |
| 7,059,868 B1 | 6/2006 | Yan | |
| 7,092,195 B1 | 8/2006 | Liu et al. | |
| 7,110,289 B1 | 9/2006 | Sin et al. | |
| 7,111,382 B1 | 9/2006 | Knapp et al. | |
| 7,113,366 B1 | 9/2006 | Wang et al. | |
| 7,114,241 B2 | 10/2006 | Kubota et al. | |
| 7,116,517 B1 | 10/2006 | He et al. | |
| 7,124,654 B1 | 10/2006 | Davies et al. | |
| 7,126,788 B1 | 10/2006 | Liu et al. | |
| 7,126,790 B1 | 10/2006 | Liu et al. | |
| 7,131,346 B1 | 11/2006 | Buttar et al. | |
| 7,133,253 B1 | 11/2006 | Seagle et al. | |
| 7,134,185 B1 | 11/2006 | Knapp et al. | |
| 7,150,093 B2 | 12/2006 | Beach | |
| 7,154,715 B2 | 12/2006 | Yamanaka et al. | |
| 7,154,717 B2 | 12/2006 | Noma | |
| 7,166,173 B2 | 1/2007 | Beach | |
| 7,170,725 B1 | 1/2007 | Zhou et al. | |
| 7,177,117 B1 | 2/2007 | Jiang et al. | |
| 7,193,815 B1 | 3/2007 | Stoev et al. | |
| 7,196,880 B1 | 3/2007 | Anderson et al. | |
| 7,199,974 B1 | 4/2007 | Alfoqaha | |
| 7,199,975 B1 | 4/2007 | Pan | |
| 7,211,339 B1 | 5/2007 | Seagle et al. | |
| 7,212,384 B1 | 5/2007 | Stoev et al. | |
| 7,238,292 B1 | 7/2007 | He et al. | |
| 7,239,478 B1 | 7/2007 | Sin et al. | |
| 7,248,431 B1 | 7/2007 | Liu et al. | |
| 7,248,433 B1 | 7/2007 | Stoev et al. | |
| 7,248,449 B1 | 7/2007 | Seagle | |
| 7,270,896 B2 | 9/2007 | Parkin | |
| 7,280,325 B1 | 10/2007 | Pan | |
| 7,283,327 B1 | 10/2007 | Liu et al. | |
| 7,284,316 B1 | 10/2007 | Huai et al. | |
| 7,286,329 B1 | 10/2007 | Chen et al. | |
| 7,289,303 B1 | 10/2007 | Sin et al. | |
| 7,292,409 B1 | 11/2007 | Stoev et al. | |
| 7,296,339 B1 | 11/2007 | Yang et al. | |
| 7,307,814 B1 | 12/2007 | Seagle et al. | |
| 7,307,818 B1 | 12/2007 | Park et al. | |
| 7,310,204 B1 | 12/2007 | Stoev et al. | |
| 7,318,947 B1 | 1/2008 | Park et al. | |
| 7,333,295 B1 | 2/2008 | Medina et al. | |
| 7,337,530 B1 | 3/2008 | Stoev et al. | |
| 7,342,752 B1 | 3/2008 | Zhang et al. | |
| 7,349,170 B1 | 3/2008 | Rudman et al. | |
| 7,349,179 B1 | 3/2008 | He et al. | |
| 7,352,543 B2 | 4/2008 | Li et al. | |
| 7,354,664 B1 | 4/2008 | Jiang et al. | |
| 7,355,823 B2 | 4/2008 | Li et al. | |
| 7,363,697 B1 | 4/2008 | Dunn et al. | |
| 7,371,152 B1 | 5/2008 | Newman | |
| 7,372,665 B1 | 5/2008 | Stoev et al. | |
| 7,375,926 B1 | 5/2008 | Stoev et al. | |
| 7,379,269 B1 | 5/2008 | Krounbi et al. | |
| 7,386,933 B1 | 6/2008 | Krounbi et al. | |
| 7,389,577 B1 | 6/2008 | Shang et al. | |
| 7,417,832 B1 | 8/2008 | Erickson et al. | |
| 7,419,891 B1 | 9/2008 | Chen et al. | |
| 7,428,124 B1 | 9/2008 | Song et al. | |
| 7,430,098 B1 | 9/2008 | Song et al. | |
| 7,436,620 B1 | 10/2008 | Kang et al. | |
| 7,436,638 B1 | 10/2008 | Pan | |
| 7,440,220 B1 | 10/2008 | Kang et al. | |

(56) References Cited

U.S. PATENT DOCUMENTS

| | | | |
|---|---|---|---|
| 7,443,632 B1 | 10/2008 | Stoev et al. |
| 7,443,639 B2 | 10/2008 | Parkin |
| 7,444,740 B1 | 11/2008 | Chung et al. |
| 7,446,982 B2 | 11/2008 | Gill |
| 7,476,954 B2 | 1/2009 | Wang et al. |
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,554,775 B2 | 6/2009 | Li et al. |
| 7,583,466 B2 | 9/2009 | Kermiche et al. |
| 7,595,967 B1 | 9/2009 | Moon et al. |
| 7,606,010 B2 | 10/2009 | Parkin |
| 7,639,457 B1 | 12/2009 | Chen et al. |
| 7,646,568 B2 | 1/2010 | Zhang et al. |
| 7,660,080 B1 | 2/2010 | Liu et al. |
| 7,666,467 B2 | 2/2010 | Parkin |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,807,218 B2 | 10/2010 | Parkin |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,872,838 B2 | 1/2011 | Zhang et al. |
| 7,906,231 B2 | 3/2011 | Parkin |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,968,219 B1 | 6/2011 | Jiang et al. |
| 7,982,989 B1 | 7/2011 | Shi et al. |
| 8,008,097 B2 | 8/2011 | Parkin |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |

(56) References Cited

U.S. PATENT DOCUMENTS

| | | |
|---|---|---|
| 8,394,280 B1 | 3/2013 | Wan et al. |
| 8,400,731 B1 | 3/2013 | Li et al. |
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,537,504 B2 * | 9/2013 | Lin ........................... 360/324.11 |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 8,711,518 B1 | 4/2014 | Zeng et al. |
| 8,711,528 B1 | 4/2014 | Xiao et al. |
| 8,717,709 B1 | 5/2014 | Shi et al. |
| 8,720,044 B1 | 5/2014 | Tran et al. |
| 8,721,902 B1 | 5/2014 | Wang et al. |
| 8,724,259 B1 | 5/2014 | Liu et al. |
| 8,749,790 B1 | 6/2014 | Tanner et al. |
| 8,749,920 B1 | 6/2014 | Knutson et al. |
| 8,753,903 B1 | 6/2014 | Tanner et al. |
| 8,760,807 B1 | 6/2014 | Zhang et al. |
| 8,760,818 B1 | 6/2014 | Diao et al. |
| 8,760,819 B1 | 6/2014 | Liu et al. |
| 8,760,822 B1 | 6/2014 | Li et al. |
| 8,760,823 B1 | 6/2014 | Chen et al. |
| 8,763,235 B1 | 7/2014 | Wang et al. |
| 8,780,498 B1 | 7/2014 | Jiang et al. |
| 8,780,505 B1 | 7/2014 | Xiao |
| 8,786,983 B1 | 7/2014 | Liu et al. |
| 8,790,524 B1 | 7/2014 | Luo et al. |
| 8,790,527 B1 | 7/2014 | Luo et al. |
| 8,792,208 B1 | 7/2014 | Liu et al. |
| 8,792,312 B1 | 7/2014 | Wang et al. |
| 8,793,866 B1 | 8/2014 | Zhang et al. |
| 8,797,680 B1 | 8/2014 | Luo et al. |
| 8,797,684 B1 | 8/2014 | Tran et al. |
| 8,797,686 B1 | 8/2014 | Bai et al. |
| 8,797,692 B1 | 8/2014 | Guo et al. |
| 2002/0018919 A1 * | 2/2002 | Saito et al. .............. 428/694 TS |
| 2003/0128482 A1 * | 7/2003 | Lin et al. .................. 360/324.11 |
| 2004/0196681 A1 | 10/2004 | Xiao et al. |
| 2006/0003185 A1 | 1/2006 | Parkin |
| 2007/0053114 A1 | 3/2007 | Uesugi et al. |
| 2007/0111332 A1 | 5/2007 | Zhao et al. |
| 2008/0032159 A1 | 2/2008 | Gill |
| 2008/0179699 A1 | 7/2008 | Horng et al. |
| 2009/0027810 A1 | 1/2009 | Horng et al. |
| 2009/0128944 A1 | 5/2009 | Jang et al. |
| 2009/0194833 A1 | 8/2009 | Wang et al. |
| 2010/0290157 A1 | 11/2010 | Zhang et al. |
| 2010/0320076 A1 | 12/2010 | Zhao et al. |
| 2011/0081558 A1 | 4/2011 | Lin |
| 2011/0086240 A1 | 4/2011 | Xiang et al. |
| 2011/0102949 A1 | 5/2011 | Yuan et al. |
| 2012/0111826 A1 | 5/2012 | Chen et al. |
| 2012/0216378 A1 | 8/2012 | Emley et al. |
| 2012/0237878 A1 | 9/2012 | Zeng et al. |

(56) References Cited

U.S. PATENT DOCUMENTS

| | | |
|---|---|---|
| 2012/0298621 A1 | 11/2012 | Gao |
| 2013/0216702 A1 | 8/2013 | Kaiser et al. |
| 2013/0216863 A1 | 8/2013 | Li et al. |
| 2013/0257421 A1 | 10/2013 | Shang et al. |
| 2014/0154529 A1 | 6/2014 | Yang et al. |
| 2014/0175050 A1 | 6/2014 | Zhang et al. |

* cited by examiner

RECORDING READ HEADS WITH A MULTI-LAYER AFM LAYER METHODS AND APPARATUSES

CROSS-REFERENCE TO RELATED APPLICATIONS

This application claims priority to provisional U.S. Patent Application Ser. No. 61/830,238, filed on Jun. 3, 2013, which is hereby incorporated by reference in its entirety.

TECHNICAL FIELD

This disclosure relates to the field of magnetic heads, and more specifically, to the recording read heads with a multi-layer anti-ferromagnetic (AFM) AFM layer methods and apparatuses.

BACKGROUND

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write.

In a magnetic hard disk drive, the head typically comprises a free layer, a spacer, a pinned layer, and an exchange layer. The free layer is the sensing layer that is passed over the surface of the data bits to be read. The free layer is free to rotate in response to the magnetic patterns on the disk. The spacer is a nonmagnetic layer that separates the magnetization of the free and pinned layers. The pinned layer is usually held in a fixed magnetic orientation by its proximity to the exchange layer, which is a layer of antiferromagnetic material that fixes the pinned layer's magnetic orientation.

BRIEF DESCRIPTION OF THE DRAWINGS

The present application is illustrated by way of example, and not limitation, in the figures of the accompanying drawings in which.

DETAILED DESCRIPTION

The area density of the magnetic recording hard disk has been increasing. To meet the requirement of the track density and linear density, both smaller reader width and gap width are needed, affecting the AFM layer to have a smaller volume. As a result, due to a low Blocking Temperature Dispersion (TbD) in a small Magnetic Tunnel Junction (MTJ) device, the thermal stability of the pinned layer may worsen. In addition, the pinning strength or exchange filed need to increase to maintain the pinned layer stable.

Figure 1:
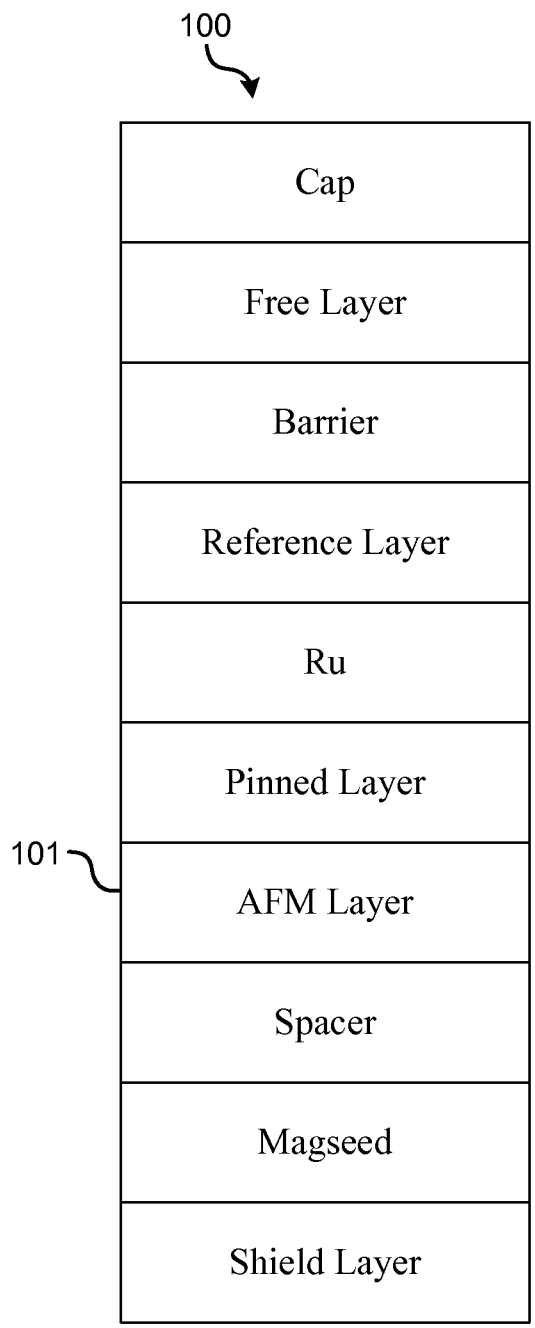
FIG. 1 illustrates a prior art read head film stack.

FIG. 1 illustrates a prior art read head 100 film stack. As illustrated, the read head 100 comprises an AFM layer 102 having only one layer of AFM layer 101. The AFM layer 102 uses an iridium manganese (IrMn) film (e.g., an IrMn film having 75% of Mn composition). The AFM layer 102 is usually deposited by using Argon (Ar) gas.

The prior art read head 100 has some disadvantages. First, it is difficult to maintain a large exchange field (Hex) and a high TbD. A larger grain size is required to keep a high TbD, which causes Hex to drop. Second, the Mn composition of the IrMn film is not uniform due to the interface diffusion. On the surface of the film, the Mn composition is much lower than the center. As such, the performance of the read head is greatly affected.

In the following description, numerous specific details are set forth to provide a thorough understanding of various embodiment of the present application. It will be apparent however, to one skilled in the art that these specific details need not be employed to practice various embodiments of the present application. In other instances, well known components or methods have not been described in detail to avoid unnecessarily obscuring various embodiments of the present application.

The terms "leading," and "trailing" refer to the direction of flight of the slider. The terms "inner" and "outer" refer to the disk radial direction when the slider is flying. The term "depth" refers to distance perpendicular to the plane of flight from the slider surface closest to the disk surface.

Apparatuses and methods of recording read heads with a multi-layer anti-ferromagnetic (AFM) layer are provided. The AFM layer has gradient Manganese (Mn) compositions. Various embodiments comprise a multi-layer AFM layer comprising multiple AFM sub-layers having different Mn compositions. In some embodiments, an upper AFM sub-layer has a higher Mn composition than a lower AFM sub-layer. Each AFM sub-layer may comprise a layer of film. These layers of films may be deposited from the same target (e.g., an IrMn target). Different film compositions with a big range may be obtained from the same target by using Krypton (Kr) gas. In various embodiments, different types of gases may be used to deposit each sub-layer and the flow of each gas may be adjusted.

In some embodiments, the AFM layer comprises two layers of films: 1) a first layer of IrMn film of which the Mn composition is less than 77%, and 2) a second layer of IrMn film of which the Mn composition is between 77% to 84%. Argon (Ar) gas and Krypton (Kr) gas may be used for depositing the first layer and the second layer, respectively. Various embodiments may provide both a large exchange field (Hex) and a good Ruthenium (Ru) Synthetic Anti-ferromagnetic (SAF). Some embodiments with a bi-layer AFM layer may provide both a large Hex and a high Tbd (a larger grain size and good orientation).

Figure 2:
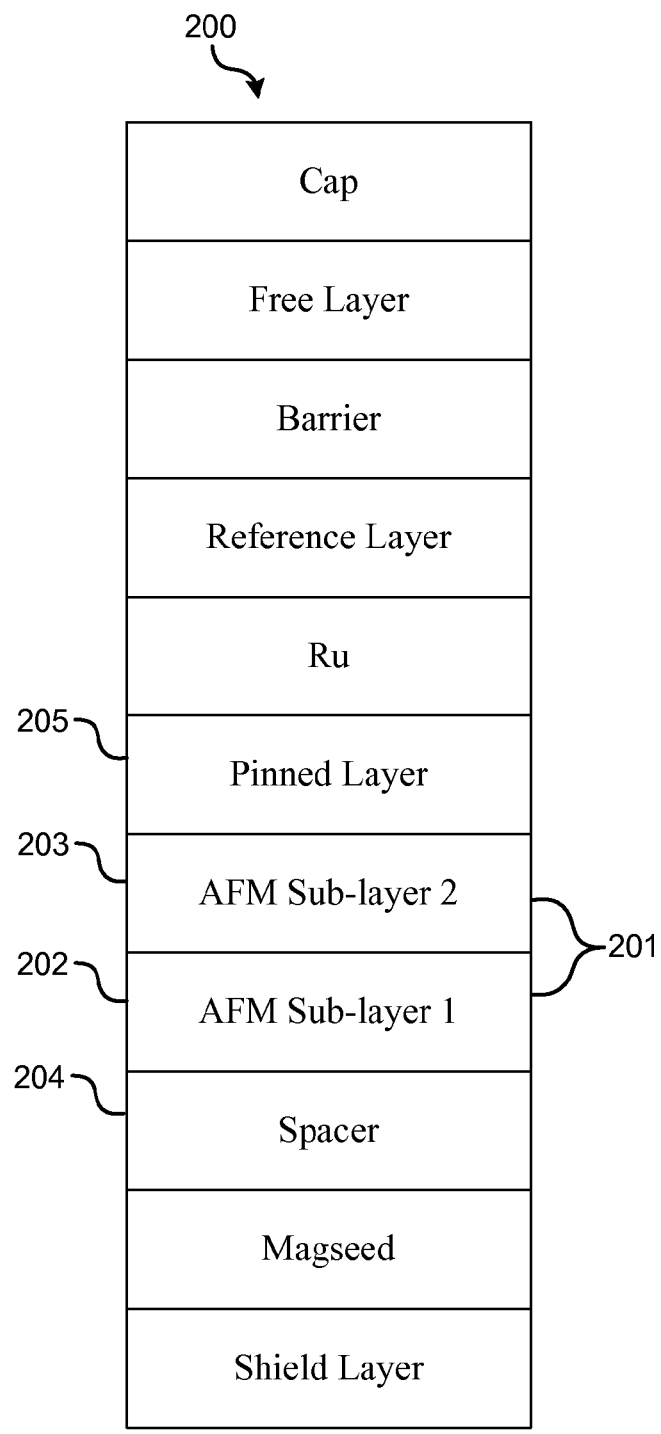
FIG. 2 illustrates an example read head with a multi-layer AFM layer film stack in accordance with an embodiment.

FIG. 2 illustrates an example read head 200 with a multi-layer AFM layer 201 film stack in accordance with an embodiment. In the illustrated example, the illustrated read head 200 comprises a multi-layer AFM layer 201. The multi-layer AFM layer 201 comprises a first AFM sub-layer 202 and a second AFM sub-layer 203. One of ordinary skill in the art would understand that a multi-layer AFM layer may have two or more AFM sub-layers. As illustrated, in the read head 200, the multi-layer AFM layer 201 is sandwiched between a spacer 204 and a pinned layer 205.

In various embodiments, the multi-layer AFM layer has a gradient Manganese (Mn) composition. Each AFM sub-layer may comprise a Manganese alloy film. In some embodiments, an iridium manganese (IrMn) films may be used as an AFM sub-layer. Different AFM sub-layers have different Mn compositions. In some embodiments, a lower-level AFM sub-layer has a lower Mn composition than an upper-level AFM sub-layer. As such, a multi-layer structure is provided because a sub-layer having a lower Mn composition has good orientation.

In one embodiment, the first AFM sub-layer 202 comprises a first IrMn film, of which the Mn composition is less than 77%, The second AFM sub-layer 203 comprises a second IrMn film, of which the Mn composition is between 77% and 84%. In various embodiments, when fabricating a multi-layer AFM layer, the AFM sub-layers may be deposited from the same target (e.g., an IrMn target). For example, a first IrMn film and a second IrMn film may be deposited from the same target. Different types of gases may be used when depositing different AFM sub-layers. In some embodiments, the first AFM sub-layer 202 is deposited using Argon (Ar) gas and the second AFM sub-layer 203 is deposited using Krypton (Kr) gas.

The flow rate of different types of gases may be adjusted. The flow rate may affect the Mn composition of different AFM sub-layers. For example, the Mn composition may be insensitive to the flow rate of Ar gas, but very sensitive to the flow rate of Kr gas. In addition, by using Kr gas, the Mn composition can be controlled to be higher than the target's Mn composition. As such, the Mn composition of each AFM sub-layer may be adjusted to provide a multi-layer AFM layer having a gradient Mn composition.

In various embodiments, a multi-layer AFM layer is sandwiched between a spacer and a pinned layer. In some embodiments, the first AFM sub-layer 202 is deposited onto the spacer 204 and the second AFM sub-layer 203 is deposited onto the first AFM sub-layer 202.

Table 1 illustrates the performance of a bi-layer AFM layer and a full stack with different film structures in accordance with various embodiments. As illustrated, the embodiment with the AFM layer that has a single IrMn film with 76% Mn composition has a low Hex for the AFM layer. The embodiment with the AFM layer that has a single IrMn film with 79% Mn composition has a low Hex for the full stack, which indicates that the Ru SAF is weak. However, the embodiment with a bi-layer AFM layer comprising a first layer of IrMn film with 76% Mn composition and 28 Å thickness and a second layer of IrMn film with 79% Mn composition and 30 Å thickness, provides a high Hex for both the AFM layer and the full stack. As such, a large exchange field (Hex) and a strong Ru SAF are both achieved.

TABLE 1

| | | AFM/Pin bi-layer | | Full Stack | |
|---|---|---|---|---|---|
| t_IrMn76%(A) | t_IrMn79%(A) | Hcp(Oe) | Hex(Oe) | H's(Oe) | Hex(Oe) |
| 28 | 30 | 257 | 1830 | 3243 | −5549 |
| 58 | 0 | 299 | 1458 | 3188 | −5392 |
| 0 | 58 | 278 | 1710 | 3455 | −3917 |

In the foregoing specification, embodiments of the application have been described with reference to specific exemplary features thereof. It will, however, be evident that various modifications and changes may be made thereto without departing from the broader spirit and scope of the application as set forth in the appended claims. The specification and figures are, accordingly, to be regarded in an illustrative rather than a restrictive sense.

What is claimed is:

1. A read head, comprising:
a non-magnetic spacer layer;
an anti-ferromagnetic (AFM) layer directly on top of the spacer layer, the AFM layer consisting of:
a first AFM sub-layer comprising Manganese (Mn); and
a second AFM sub-layer directly on top of the first AFM sub-layer and comprising Mn, wherein the second AFM sub-layer has a higher Mn composition than the first AFM sub-layer; and
a pinned magnetic layer directly on top of the second AFM sub-layer.

2. The read head of claim 1, wherein the AFM layer has a gradient Manganese (Mn) composition.

3. The read head of claim 1, wherein the first AFM sub-layer comprises a first iridium manganese (IrMn) film and the second AFM sub-layer comprises a second IrMn film.

4. The read head of claim 1, wherein the first AFM sub-layer and the second AFM sub-layer are deposited from a target using different gases.

5. The read head of claim 4, wherein the first AFM sub-layer is deposited using Argon gas.

6. The read head of claim 4, wherein the second AFM sub-layer is deposited using Krypton gas.

7. The read head of claim 1, wherein the AFM layer has a total thickness of about 58 angstroms.

8. The read head of claim 1, wherein the first AFM sub-layer has a thickness of about 28 angstroms.

9. The read head of claim 1, wherein the second AFM sub-layer has a thickness of about 30 angstroms.

* * * * *